United States Patent [19]

Komoriya et al.

[11] 4,218,136

[45] Aug. 19, 1980

[54] METHOD OF AND APPARATUS FOR ALIGNING PHOTOMASK

[75] Inventors: Susumu Komoriya, Tachikawa; Koyo Morita, Higashimurayama; Hiroshi Nishizuka, Kodaira; Hisashi Maejima, Higashiyamato, all of Japan

[73] Assignee: Hitachi, Ltd., Japan

[21] Appl. No.: 943,651

[22] Filed: Sep. 19, 1978

[30] Foreign Application Priority Data

Sep. 22, 1977 [JP] Japan .............................. 52/113357

[51] Int. Cl.$^2$ .............................................. G03B 27/20
[52] U.S. Cl. ....................................... 355/79; 355/91; 355/132; 355/133
[58] Field of Search ..................... 355/79, 132, 78, 85, 355/91–94, 133

[56] References Cited

U.S. PATENT DOCUMENTS

| | | | |
|---|---|---|---|
| 3,645,622 | 2/1972 | Cachon et al. | 355/132 |
| 3,955,163 | 5/1976 | Novak | 355/91 X |
| 4,054,383 | 10/1977 | Lin et al. | 355/91 |

*Primary Examiner*—Richard A. Wintercorn
*Attorney, Agent, or Firm*—Craig & Antonelli

[57] ABSTRACT

A method of making a mask and a wafer intimately contact each other by means of such a mask aligning apparatus comprising a base having a chamber, a piston apparatus movable up and down in the chamber, a wafer chuck provided at one end of the piston apparatus and adapted to fix the wafer, means for fixing the mask to the upper surface of the wafer in a superposed relationship, drive means adapted to impart a driving force to the piston, so as to move the wafer toward the mask, and means for biasing the piston apparatus in the direction to move the wafer away from the mask. The method comprises the steps of bringing the wafer by the drive means into positive contact with the mask fixed by the fixing means, sealing the wafer in an airtight manner in cooperation with the mask, lowering the pressure of the atmosphere around the wafer below atmospheric pressure, so as to cause a bending of the mask from the fixed position, to thereby cause the wafer to contact pressingly the central area of the mask, and expelling gas from the wafer chuck so as to make the entire region of the wafer intimately contact the mask.

By adopting the method and apparatus of the invention, it is possible to smoothly bring the mask and wafer into intimate contact with each other, without adversely affecting the previously obtained mutual alignment of these two members. At the same time, the separation of the mask and the wafer from each other, after the contact and exposure, can be made in a shorter time. As a result, damaging of the mask pattern in the course of the mask alignment is avoided, and the yield of the wafer product is much improved.

10 Claims, 8 Drawing Figures

METHOD OF AND APPARATUS FOR ALIGNING PHOTOMASK

BACKGROUND OF THE INVENTION

The present invention relates to a method of and apparatus for aligning a photomask, suitable for use in, for example, a masking exposure step of a selective photo-etching process in the field of the semiconductor industry and, more particularly, to a method of and apparatus for effecting the mutual contact of a semiconductor wafer and a mask, as well as separation of the same from each other.

A mask aligning apparatus has been disclosed, for example, in the specification of U.S. Pat. No. 3,645,622, in which a wafer chuck, supporting a wafer to be aligned with a mask, is disposed beneath the mask. The wafer chuck is capable of up and down movement, so that the wafer may be brought into contact with the lower surface of the mask.

In this type of apparatus, it is essential to press the wafer against the mask at a predetermined contact pressure, without causing damage such as scratching a mask having a certain pattern, e.g., a circuit pattern of a semiconductor integrated circuit, and without damaging the wafer itself. At the same time, it is essential that the wafer and the mask be held in mutual contact, of a predetermined intimacy, during the final exposure step which is effected subsequent to the mask alignment. In the case of a mask having a fine pattern of elements and wirings as those of a large scale integrated circuit, inadequate contact of the mask and the wafer with inferior intimacy will deteriorate the resolution of the fine pattern, resulting in a small yield of the acceptable wafer product.

In the known apparatus of the kind described, no means are provided for finely controlling and adjusting the bend of the mask contacting the wafer during the exposure. Therefore, it is often experienced that the mutual contact of the mask and wafer for the exposure is not made with the desired intimacy in the predetermined plane of contact. If the exposure is effected in such a state, the resolution of the fine pattern will be seriously deteriorated resulting in a reduction of the yield of the acceptable wafer product or a dimensional error of the pattern formed by the exposure.

SUMMARY OF THE INVENTION

It is, therefore, a major object of the invention to provide a method of and apparatus for making a mask and a wafer intimately contact each other, capable of finely controlling the amount of bend of the mask during the exposure.

It is another object of the invention to provide a method of making a mask and a wafer intimately contact each other, capable of preventing the mask and the wafer from coming out of mutual alignment.

It is still another object of the present invention to provide a method of making a mask and a wafer intimately contact each other, capable of reducing the time required for the accomplishment of the intimate contact and capable of affording an easy separation of the mask and the wafer from each other.

It is a further object of the present invention to provide a device for detecting the intimacy of the contact between the mask and the wafer adapted for use in an apparatus for carrying out the above-stated methods, and, more generally, to provide a method of and a device for finely detecting the intimacy of the mutual contact of the two objects, suitable for use in, for example, mask aligning apparatus, in order to detect the intimacy of contact between the mask and the wafer.

The above and other objects, as well as advantageous features of the invention will become more clear from the following description of the preferred embodiments taken in conjunction with the accompanying drawings.

DESCRIPTION OF THE PREFERRED EMBODIMENTS

Figure 1:
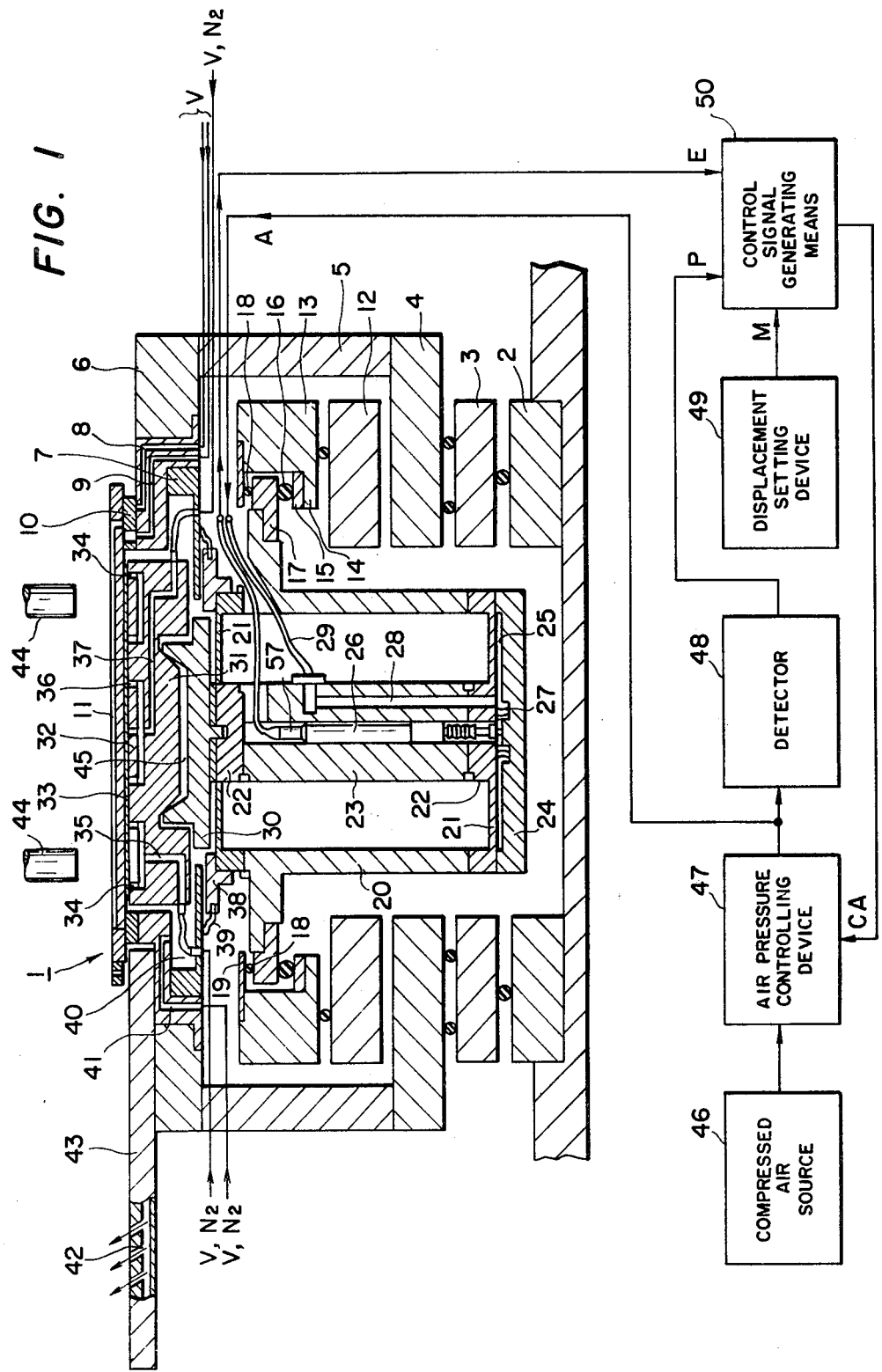
FIG. 1 is a sectional view of a mask aligning apparatus in accordance with the present invention.

Referring first to FIG. 1, a mask aligning apparatus of the invention, generally designated at a numeral 1, has the following construction.

On a fixed base 2, there is provided a scan table consisting of a scan Y table 3 and a scan X table 4 which are movable in a plane in orthogonal Y and X directions. A plurality of posts 5 are fixed to the peripheral portions of the scan X table 4, and carry an upper base 6. This upper base 6 has a central circular space in which fixedly received is a doughnut-like mask holder sucking plate 7 having flat upper and lower surfaces. This mask holder sucking plate 7 is provided with pipes 8 and 9 for supplying a vacuum, so that a mask holder 10 mounted on the plate 7 and a mask 11 may be sucked and fixed by the force of the vacuum. At the same time, framelike alignment Y table 12 and alignment X table 13 are superposed and disposed on the scan X table 4, so as to form an alignment table which is freely movable in the X and Y directions.

The alignment X table is provided at its inner lower portion with a flange 14 to which is fixed a doughnut-like retainer 15. An alignment $\theta$ table 17 is carried by the retainer 15 through steel balls 16, for free angular movement by an angle $\theta$ in a plane. The alignment $\theta$ table 17 carries steel balls 18 which in turn are pressed at their top portions by a doughnut-like pressing plate 19 fixed to an upper portion of the alignment X table 13.

A tubular main body 20 of a lifting and lowering mechanism is fixed to the inside of the alignment $\theta$ table 17. Blocks 22 having peripheral leaf spring portions 21 are fixed to the upper and the lower surfaces of the tubular main body 20. These blocks 22 are connected to each other at their central portions by means of a shaft 23. A disc-shaped cover 24 is fixed to the lower surface of the lower block 22, so as to form an air chamber 25 therebetween.

A deviation detector 26, such as an electric micrometer, is disposed within the shaft 23. The detecting end of the detector 26 is made to pass through the lower block 22, so as to oppose the inner surface of the cover 24.

A seal 27 is disposed to surround the detecting end of the detector 26. The air chamber 25 is adapted to be charged with a compressed air, through pipes 28 and 29.

As the compressed air is fed to the air chamber 25, the peripheral leaf spring portions 21 of the blocks 22 are elastically deflected, so that a piston apparatus consisting of blocks 22 and the tubular main body 20 is moved upward. As will be described later, the amount of deflection of the leaf spring portions 21 is in direct proportion to the pneumatic pressure in the air chamber 25. The spring constant of the leaf spring portions 21 is abruptly changed when a wafer mounted on the piston apparatus comes into contact with the mask sucked by and fixed to the mask holder sucking plate 7. The clearance between the mask and the wafer is precisely controlled upon detecting the slight contact of the mask and the wafer, by making use of the above-stated abrupt change in the spring constant.

A spherical seat receiving plate 30 fixed to the upper surface of the upper block 22 carries a spherical seat 31 which in turn carries a wafer chuck 32 for fixing the wafer. A plurality of sucking ports 34 opening in the peripheral portions of the upper surface of the wafer chuck 32 are in communication with a pipe 35, whereas a plurality of sucking ports 36 opening in the central portion of the upper surface of the wafer chuck 32 are in communication with another pipe 37. These pipes 35 and 37 are adapted to introduce and deliver a vacuum or, alternatively $N_2$ gas, to the mask 11.

The space 45 defined by the spherical seat receiving plate 30 and the spherical seat 31 is adapted to be charged with an inert gas such as $N_2$ gas or, alternatively, supplied with a vacuum pressure.

In order to obtain a sufficiently intimate contact of the wafer 33 and the mask 11, a supporting plate 38 is fixed to the outer surface of the upper block 22. The supporting plate 38 is provided with a bellows 39. The bellows 39, block 22, mask holder sucking plate 7, and the mask 11 in combination define an air chamber 40. A pipe 41 for introducing a vacuum or a gas to the air chamber 40 is formed in the mask holder sucking plate 7.

A wafer unloader table 43 having an air bearing mechanism 42 is attached to one side surface of the upper base 6.

On the other hand, a scope 44 for the alignment is disposed above the mask holder 10, by means of which the mutual alignment of the mask and the wafer is observed. At the same time, an exposure mechanism (not shown) is disposed above the mask holder 10, so as to effect the exposure after the alignment has been achieved.

The aligning apparatus of the invention constructed as described has the following structural features.

Firstly, means are provided for continuously detecting the state of contact or the closeness between the semiconductor wafer 33 and the mask 11. As will be made clear in the description of the operation of the whole aligning apparatus, which will be made later, in the practical aligning and exposure steps, it is necessary to repeatedly press the mask and the wafer against each other or to bring them into a predetermined close proximity of each other, in the steps before and after the alignment. According to the invention, the above stated operation is performed in the following manner.

Figure 2:
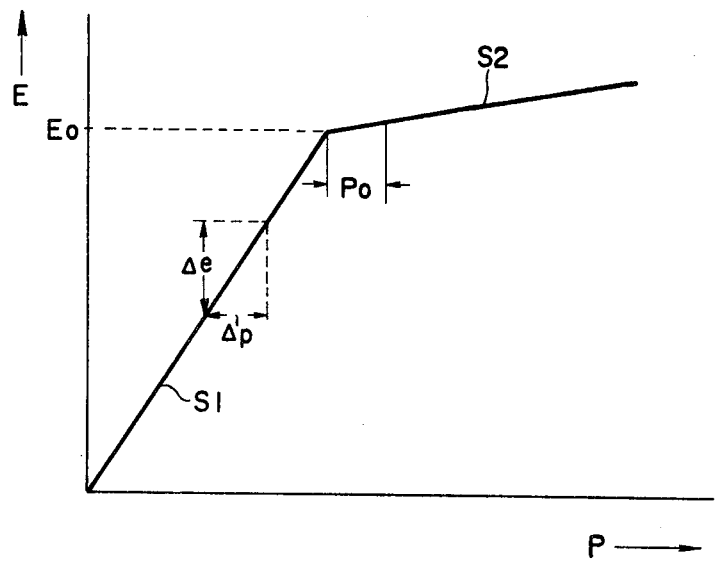
FIG. 2 is a graph showing how a deviation output (E) is changed in response to the change in supplied air pressure (P), for explaining a supply pressure controlling device as used in carrying out the invention.

The wafer chuck 32 is moved up and down along with the shaft 23 as the pressure of the air supplied to the air chamber 25 through the pipe 28 is controlled. The deviation or displacement of the wafer chuck in the vertical direction is detected by the deviation detector 26. The present inventors have noticed that the pressure P of the supplied air is in direct proportion to the deviation output E as obtained from the output terminals 45 of the deviation detector 26, as shown in FIG. 2. Namely, within the limit of elasticity of the leaf spring 21 in which a stress is caused in the spring, there is a linear relationship as shown by a linear curve S1, between the pressure P of the supplied air, which is in this case the driving force, and the deviation output E which is in this case the displacement of the wafer chuck 32. Thus, there is a relationship represented by an equation $E=KP$. In this equation, K represents a proportionality constant which can be expressed by $K=\Delta e/\Delta p$, representing the changes in the pressure and the position by $\Delta p$ and $\Delta e$, respectively. This proportionality constant is kept constant until the wafer chuck comes in such a close proximity of the mask 11 as to receive a resistance force exerted by the mask 11. In other words, the proportionality constant is made to change when the wafer chuck is brought to such a close proximity of the mask 11.

Namely, referring to FIG. 2, the wafer chuck 32 or the wafer 33 carried by the latter is brought into contact with the mask 11, so as to be resisted by the latter, when the deviation output is Eo. Then, as the air supplying pressure P is further increased, the deviation output E changes following a line S2 having a gradient, i.e., the proportional constant, different from that of the line S1.

According to the invention, the position of the mask is precisely detected by sensing the point at which the proportionality constant is changed, and the vertical displacement of the wafer chuck is finely controlled in relation to the thus detected position of the mask, by means of the following system.

Turning again to FIG. 1, the pressure of air A supplied from a compressed air source 46 through the pipes 29, 28 is controlled by means of an air pressure controlling device 47. This device 47 is constituted by, for example, a finely adjustable reducing valve adapted to be actuated and operated by a pulse motor, and is adapted to control the pressure P of the air A in accordance with a control signal CA delivered by the control signal generating device 50. The pressure P of the supplied air is detected by a detector 48 the output from which is delivered to the control signal generating means 50. The control signal generating device 50 is adapted to receive also the deviation output E produced by the deviation detector 26, and a displacement signal M delivered by a wafer-chuck displacement setting device 49. Upon receipt of the input signals P, E, and M, the control signal generating device 50 produces the control signal CA by means of which the controlling operation as explained in relation to FIG. 2 is performed.

Figure 3:
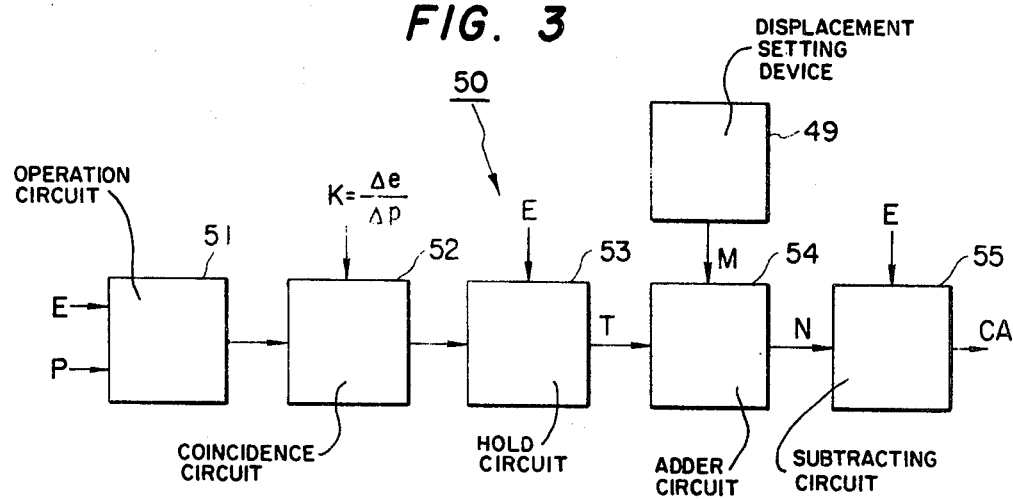
FIG. 3 is a system block diagram of the supplying pressure controlling device as used in carrying out the invention.

Referring now to FIG. 3, the control signal generating device 50 is provided with an operation circuit 51 adapted to calculate the ratio of the supplied air pressure P to the deviation E and to produce a signal proportional to the calculated ratio. A coincidence circuit 52 is adapted to compare the output from the operation circuit 51 with a predetermined proportional constant of the linear curve S2, and to set a hold circuit 53 when the coincidence is achieved, thereby to make the hold circuit 53 hold the deviation output E at that instant.

The hold circuit 53 holds the deviation output E in accordance with the set output from the coincidence circuit 52, and produces a control command T. The control command T is delivered to one of the input terminals of an adder circuit 54. The other input terminal of the adder circuit 54 receives the displacement signal M delivered by the displacement setting device 49. These two inputs are arithmetically added to each other by the adding circuit 54, the output N of which is delivered to one of the input terminals of a substracting circuit 55. The subtracting circuit 55 receives at its other input terminal the aforementioned deviation output E. The subtracting circuit 55 then calculates the difference between these two inputs N, E and delivers the output CA proportional to the calculated difference to the air pressure controlling device 47.

In the apparatus as shown in FIG. 1, the output E from the deviation detector 26 assumes the minimum level when the wafer-chuck 32 is a such a position where it is supported solely by the leaf spring positions 21, 21. Then, a displacement signal M is delivered to the adder circuit 54, so as to operate the displacement setting device 49 such that the wafer-chuck 32 temporarily abuts or contacts the mask 11. In this case, the adder circuit 54 does not receive the command signal T from the hold circuit 53, because the command signal has not been established yet.

Consequently, the displacement signal M is delivered to the subtracting circuit 55 as the added signal N. The subtracting circuit 55 then calculates the difference between the signal N and the deviation output E, and produces a controlling signal CA proportional to the calculated difference. This difference becomes smaller as the deviation output E comes closer to the set level of the displacement signal M. Then, as the wafer-chuck 32 comes into contact with the mask 11, the controlling command is established in the following manner.

As explained before, the operation circuit 51 adapted to calculate the ratio of the air supply pressure P to the deviation output E delivers an output corresponding to the proportional constant of the linear curve S2 to the coincidence circuit, when the wafer 33 is brought into contact with the mask 11. Consequently, in the coincidence circuit 52, the coincidence of the received signal and the previously set proportionality constant input with each other is obtained, so that the hold circuit 53 holds the value of the deviation output E at that instant. The hold output T at this instant in itself is the command signal which instructs the system of the exact level or height of the mask 11. It is possible to keep the wafer 33 in slight, soft contact with the mask 11, by resetting the displacement setting device simultaneously with the establishment of the command, so as to enable the controlling system to follow the newly established command.

Subsequently, the control system as shown in FIG. 3 performs a fine control of the displacement, through a setting of a corrected displacement by the displacement setting device 49 on the basis of the established command.

For instance, referring to FIG. 2, it is possible to keep the wafer 33 in contact with the mask 11 at a certain positive contacting pressure, by selecting a displacement corresponding to an air supplying pressure Po which is slightly higher than that by which the wafer 33 is made to contact the mask 11 substantially with no contacting pressure, so that the deflection amount of the mask 11 is conveniently controlled.

On the contrary, if is also possible to produce a state of so-called separation or proximity in which the wafer 33 is held slightly apart from the mask 11 by selecting a displacement corresponding to another air pressure which is slightly lower than the above-stated air supplying pressure.

As will be described below, the control of the deflection amount of the mask is performed when the pressure in the air chamber 40 is reduced to vacuum, so as to produce a condition of a close contact, by an application of a vacuum V.

Figure 4:
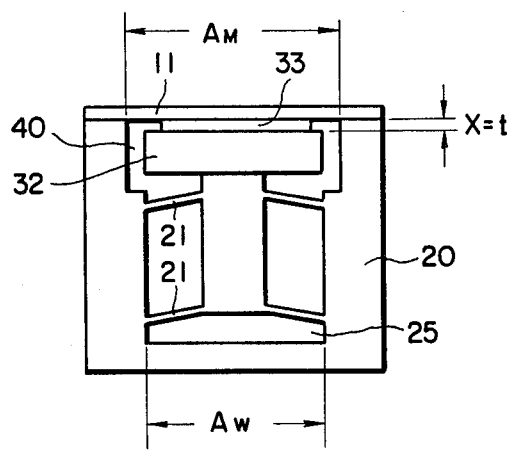
FIGS. 4 through 8 are schematic sectional view of the mask aligning apparatus as shown in FIG. 1.

The second feature of the invention resides in that the wafer 33 is adapted to be confined in the air chamber 40 which is defined by the mask 11, leaf springs 21, sealing bellows 39, and the mask holder sucking plate 7. The vacuum in this chamber 40 is adjustable by means of an air pressure adjusting means including the pipe 41. Further, it is to be noted that, as will be seen from FIG. 4 schematically showing the aligning apparatus, the pressure receiving area AM of the mask is made larger than the pressure receiving area AW of the piston apparatus including the vertically movable shaft 23, which is determined by the inner diameter of the tubular main body 20.

Figure 6:
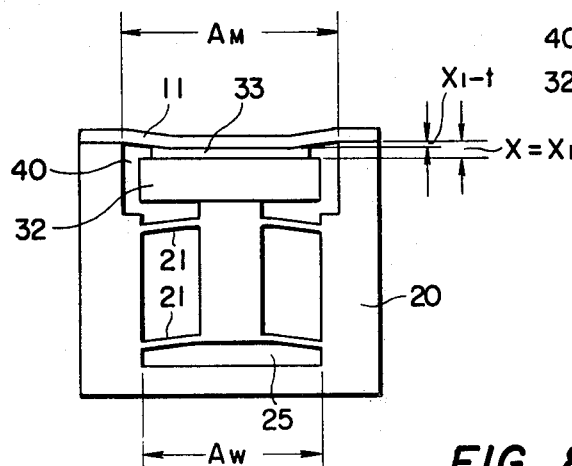

The construction of the air chamber 40 offers the following advantage. Namely, in the step of making the wafer and the mask contact intimately with each other, which step is carried out subsequent to the mask alignment, the mask 11 is bent downwardly as shown in FIG. 6 by making use of the fact that the pressure receiving area AM is greater than the pressure receiving area AW, so that the mask and the wafer may make a positive and intimate contact at the central portion of the latter, After the intimate contact is accomplished at the center of the wafer, the area of the intimate contact is gradually spread radially outwardly, in the form of concentric circles of increasing diameters. Consequently, the wafer and the masks are brought into contact with each other at the required intimacy, without departing from the mutual alignment which has been previously obtained in the preceding aligning step.

Figure 7:
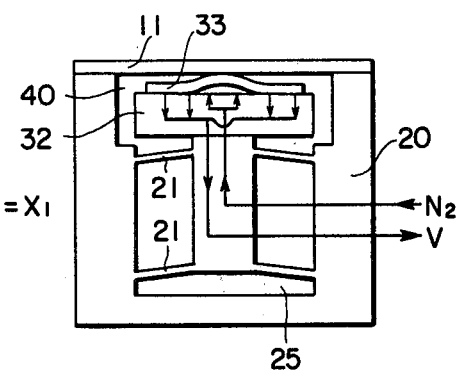

A third feature of the invention resides in that the ports 34, 36 for jetting an inert gas such as $N_2$ gas are formed in the wafer-chuck 32. Needless to say, these ports are used in certain steps of the process for applying the vacuum V so as to hold the wafer on the wafer-chuck 32. Further, it is to be noted that the ports 34, 36 are disposed to open in two independent regions, i.e. at the center of the wafer-chuck 32 and in the peripheral portion of the same. In the step for the intimate contact of the wafer and the mask, at first the $N_2$ gas is jetted from the ports 36 disposed in the center, as shown in FIG. 7, so as to preferentially obtain the intimate contact at the central portion of the wafer. Then, the $N_2$ gas is jetted from the peripheral ports 34, so as to promote the intimate contact also at the peripheral portion of the wafer.

Consequently, the intimate contact of the mask and the wafer is promoted, without allowing an air layer to be formed therebetween.

It will be seen that the separation of the mask and the wafer from each other, which is to be made subsequent to the exposure, can easily be performed by taking the described steps in the reverse order.

A fourth feature of the invention resides in that a mechanism is provided for adjusting the air supplying pressure in the air chamber 25 in the step of making the wafer and mask contact with each other intimately. The position of the wafer at which it makes contact with the reference or standard surface of the mask is memorized by the aforementioned controlling device, when the chamber 40 is maintained at the atmospheric pressure.

Figure 8:
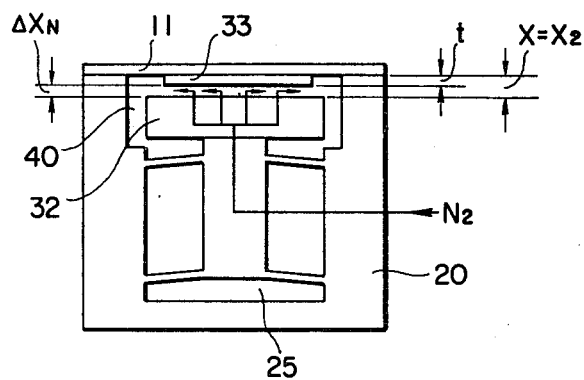

Then, in the step as shown in FIG. 8, the relationship between the flow rate QN of the $N_2$ gas and the displacement $\Delta XN$ is experimentally obtained. Then, the value of $\Delta XN$ is delivered to the mechanism for controlling the air supplying pressure in the air chamber 25, so that the air pressure P may be controlled such that the deviation output E corresponding to the standard position may be lowered by $\Delta XN$. Consequently, the air supplying pressure P is controlled to lower the position of the wafer-chuck from the standard position by a distance corresponding to $\Delta XN$. This arrangement is effective in diminishing the bend of the mask.

Hereinafter, a description will be made as to the operation of the whole apparatus as shown in FIG. 1.

At first, a wafer 33 delivered by an automatic wafer supplying mechanism (not shown) is sucked and held by the wafer-chuck 32 to which the vacuum V is applied through the pipes 35 and 37. Then, a mask 11 and a mask holder 10, delivered by an automatic mask supplying apparatus (not shown), are held by means of the vacuum V introduced through the pipes 8 and 9. Then, an initial or starting displacement is set by the displacement setting device 49, so as to control the air supplying pressure in the air chamber 25, thereby to bring the wafer 33 on the wafer-chuck 32 into contact with the mask 11. As a result, the controlling command is established in accordance with the level or height of the mask 11, in the manner explained before.

In this state, the air chamber 45 of the spherical seat 31 for making the wafer-chuck 31 in parallel with the mask is kept at the atmospheric pressure or a small vacuum. Consequently, the spherical seat can be rotated freely, so as to allow the adjustment of the parallelism. In addition, in order to further ensure the parallelism of the wafer with respect to the mask, a small amount or air of $N_2$ gas is supplied to the air chamber 45 as required, subsequent to the stopping of the upward stroking of the wafer-chuck.

After the desired parallelism is obtained, the spherical seat 31 is fixed to the receiving plate 30 as the pressure in the chamber 45 is reduced to vacuum.

Subsequently, the pressure of the air supplied to the air chamber 25 is reduced by a reversing of a pulse motor (not shown) of the compressed air source, so as to adjust the distance between the mask and wafer to 20 $\mu$m or so. In this state, the operator operates the alignment tables 12, 13, and 17 while confirming the position of the target on the mask and the wafer by means of the alignment scope, so as to make the patterns of the mask and wafer coincide with each other.

Subsequently, the wafer is accurately aligned with the mask, and then the air pressure in the chamber 25 is increased again to reduce the distance between the mask and the wafer to between 5 and 10 $\mu$m. The mutual alignment of the wafer and the mask is confirmed in this state and is corrected as required.

Subsequent to this aligning step, the pressure in the chamber 25 is increased to bring the wafer into contact with the mask.

Then, a step for making the wafer and the mask contact intimately with each other, to prepare for the next exposure step, is performed in a manner which will be described hereinafter with reference to FIGS. 5 through 8.

Figure 5:
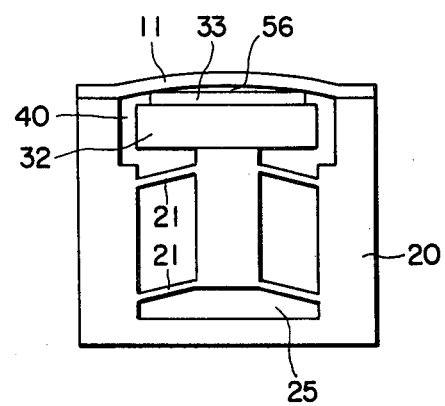

When the wafer is kept in soft contact with the mask by means of the controlling device associated with the air chamber 25, after the completion of the aligning step, the mask is bent as qualitatively shown in FIG. 5, so as to allow the presence of an air layer 56 between itself and the wafer. In order to obtain a satisfactory intimacy of the contact through eliminating this air layer 56, the pressure in the chamber 40 is made smaller than the atmospheric pressure, i.e. reduced down to a negative pressure, as shown in FIG. 6. As a result, due to the fact that the pressure receiving area AM is greater than that of area AW, the mask 11 is pressurized from its upper side to deflect downward. Consequently, the wafer 33 is pressed against the mask 11 to intimately contact the central portion of the latter, as explained previously.

Then, in order to spread the area of the intimate contact radially outwardly, in the form of concentric circles of increasing diameter, $N_2$ gas is expelled from the central portion of the wafer-chuck 32 against the wafer, as shown in FIG. 7. Subsequently, the $N_2$ gas is expelled from the peripheral portions of the wafer-chuck, so as to establish the intimate contact. In this state, although the air layer 56 between the wafer 33 and the mask 11 has been completely expelled, the mask and the wafer may be bent upwardly by the rapid flow of the $N_2$ gas.

In order to contact this bend, the pressure P of the air supplied to the chamber 25 is controlled by the control system in the manner explained before.

In the described step of obtaining the intimate contact of the wafer and the mask with each other, it is possible to neglect the preferential $N_2$ gas supply as shown in FIG. 7 which is made at the center of the wafer-chuck. However, this preferential $N_2$ gas supply at the center of the wafer-chuck is preferably adopted for an earlier elimination of the air layer 56.

Thus, according to the present invention, the wafer can be brought into an intimate contact with the mask in a shorter time, without allowing air layer to remain therebetween. In addition, since the area of intimate contact is gradually spread from the central portion to the peripheral portion, the relative movement of the mask and the wafer out of the previously obtained alignment is remarkably diminished.

After the intimate contact is obtained over the entire area, an exposure is effected on the wafer behind the masking pattern of the mask, by means of an exposure means which is not shown.

After the completion of the exposure, the wafer which is in the intimate contact with the mask as shown in FIG. 8 is separated from the mask.

This separation is effected by different methods. According to a first method, at first only the ports on the peripheral portion of the wafer-chuck are supplied with the vacuum, as shown in FIG. 7, so that the wafer may be bent at its central portion. Then, the separation of the wafer is commenced at its peripheral portion so as to promote the invasion of air.

According to the second method, in the state as shown in FIG. 6, the pressure in the chamber 40 is left unchanged. Consequently, the wafer-chuck 32 is lowered gradually, due to the action of the leaf springs 21. In this state, the mask is deflected downward, due to the atmospheric pressure acting on the upper surface thereof, so as to facilitate the invasion of air from the peripheral portion of the wafer. Then, the pressure in the chamber 40 is increased to the atmospheric pressure, thereby to complete the separation of the wafer from the mask.

It will be seen that both of these methods effectively allow an invasion of the area between the wafer and the mask by the air, so as to break the vacuum which has been established in that area, thereby to overcome the problem of the separation failure.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one or ordinary skill in the art.

What is claimed:

1. A method of making a mask and a wafer intimately contact each other by means of a mask aligning apparatus comprising a base having a chamber, a piston apparatus movable up and down in the chamber, a wafer-chuck provided at one end of the piston apparatus and adapted to fix the wafer, means for fixing the mask to the upper surface of the wafer in a superposed relationship, drive means adapted to impart a driving force to the piston, so as to move the wafer toward the mask, and means for biasing the piston apparatus in the direction to move the wafer away from the mask against the driving force, said method comprising the steps of:

bringing the wafer by a driving force of said drive means into pressure contact with the mask fixed by the fixing means, and maintaining the driving force of said drive means for the pressure contact between the wafer and the mask thereat, sealing the wafer in an airtight manner in cooperation with the mask, lowering the pressure of the atmosphere around the wafer below atmospheric pressure, so as to cause a bending of the mask from the fixed position, to thereby cause the wafer to pressingly contact the central area of the mask, expelling gas from the wafer-chuck so as to make the entire region of the wafer intimately contact the mask, and readjusting said driving force of said drive means maintained in said bringing step to a driving force below it so as to prevent the bend of the wafer and the mask.

2. In a mask aligning apparatus including a base having a chamber, a piston apparatus movable up and down in said chamber, a wafer-chuck provided at one end of said piston apparatus and adapted to fix said wafer, means for fixing a mask to the upper surface of said wafer is superposed relationship, drive means adapted to impart a driving force to said piston, so as to move said wafer toward said mask, and means for biasing said piston apparatus in the direction to move said wafer away from said mask against said driving force, the improvement comprising:

drive controlling means adapted to control said driving force of said drive means so that said wafer may contact said mask fixed by said fixing means at a predetermined contacting pressure, said drive controlling means including means for detecting the position of said mask by sensing, while said wafer-chuck is on its way toward said mask, a change in a proportionality constant determining the proportional relationship existing between the displacement of said wafer-chuck and said driving force, and means for controlling the displacement of said wafer-chuck on the basis of the position of said mask detected by said detecting means;

sealing means for sealing said wafer on said wafer-chuck in an airtight manner in cooperation with said mask fixed by said fixing means;

bending means including a pressure adjusting means for lowering the pressure in said sealing means below the atmospheric pressure when said wafer and said mask are made to intimately contact each other, to thereby bend said mask from its fixed position downwardly toward said wafer located beneath said mask, such that said mask and said wafer pressingly contact each other at the central portion of said mask; and gas-jetting means for jetting an inert gas from said wafer-chuck toward said wafer, so as to make said wafer intimately contat said mask.

3. An apparatus as claimed in claim 2, wherein said bending means is configured so that the area of the pressure receiving surface of said piston apparatus residing in said sealing means and subjected to the pressure in said sealing means is smaller than the area of the portion of said mask residing in said sealing means.

4. An apparatus as claimed in claim 2, wherein said gas-jetting means includes at least one gas jetting port provided at the center of said wafer-chuck and second gas-jetting ports provided in the peripheral portion of said wafer-chuck.

5. An apparatus as claimed in claim 2, wherein said gas-jetting means includes at least one gas jetting port provided at the center of said wafer-chuck and second gas-jetting ports provided in the peripheral portion of said wafer-chuck.

6. An apparatus as claimed in claim 3, wherein said gas-jetting means includes at least one gas jetting port provided at the center of said wafer-chuck and second gas-jetting portions provided in the peripheral portion of said wafer-chuck.

7. A method of positioning a semiconductor wafer with respect to a photomask for photographic exposure, said method comprising the steps of:

positioning a semiconductor wafer on a movable wafer-chuck with respect to a fixed photomask, said movable wafer-chuck being capable of reciprocating under one side of said fixed photomask in the direction perpendicular to said fixed photomask;

moving said movable wafer-chuck toward said fixed photomask to contact said semiconductor wafer with said fixed photomask;

drawing a vacuum in a housing being defined with said fixed photomask and said wafer-chuck to bend said fixed photomask and to thereby cause said semiconductor wafer to contact with the central portion of said fixed photomask;

jetting an inert gas from said wafer-chuck toward said semiconductor wafer to contact the entire region of said semiconductor wafer with said fixed photomask; and moving said movable wafer-chuck with respect to said fixed photomask to substantially flatten said semiconductor wafer and said fixed photomask which are contacted with each other by the jet of said inert gas.

8. A mask aligning apparatus for accurate alignment of a semiconductor wafer to a mask, said mask aligning apparatus comprising:

means for fixing said mask to a predetermined position;

a wafer-chuck for receiving said semiconductor wafer thereon;

support means for elastically supporting said wafer-chuck to thereby cause said wafer-chuck to be movable up and down in superposed relationship between said semiconductor wafer and said mask;

drive means for supplying a driving force to said wafer-chuck within the limit of elasticity of said support means;

detecting means for detecting a change in a proportionality constant determining the proportional relationship existing between the displacement of said wafer-chuck and said driving force, when said wafer-chuck is moved toward said fixed mask by said driving force, to thereby sense the position of said wafer-chuck; and control means for controlling the driving force of said drive means on the basis of the position of said wafer-chuck detected by said detecting means, to thereby set the position of said wafer-chuck to a desired level.

9. A mask aligning apparatus as claimed in claim 8, wherein said control means comprises first means for detecting the driving force of said drive means; second means for generating an output representative of the position of said wafer-chuck to be set; and third means for receiving the outputs of said detecting means, first means and second means, and controlling the driving force of said drive means in response to the outputs thereof.

10. In a mask aligning apparatus including a base having a chamber, a piston apparatus movable up and down in said chamber, a wafer-chuck provided at one end of said piston apparatus and adapted to fix said wafer, means for fixing said mask to the upper surface of said wafer in superposed relationship, drive means adapted to impact a driving force to said piston, so as to move said wafer toward said mask, and means for biasing said piston apparatus in the direction to move said wafer away from said mask against said driving force, the improvement comprising:

means for detecting the position of said mask by sensing a change in a proportionality constant determining the proportional relationship existing between a displacement of said wafer-chuck and said driving force, and means for controlling the displacement of said wafer-chuck on the basis of the position of said mask detected by said detecting means.

* * * * *